(12) United States Patent
Nakamura et al.

(10) Patent No.: US 7,772,596 B2
(45) Date of Patent: Aug. 10, 2010

(54) LIGHT-EMITTING ELEMENT AND METHOD OF MANUFACTURING THE SAME, AND LIGHT-EMITTING DEVICE USING THE LIGHT-EMITTING ELEMENT

(75) Inventors: Yasuo Nakamura, Machida (JP); Hisao Ikeda, Atsugi (JP); Junichiro Sakata, Atsugi (JP)

(73) Assignee: Semiconductor Energy Laboratory Co., Ltd, Atsugi-shi, Kanagawa-ken (JP)

(*) Notice: Subject to any disclaimer, the term of this patent is extended or adjusted under 35 U.S.C. 154(b) by 777 days.

(21) Appl. No.: 11/578,086

(22) PCT Filed: Apr. 21, 2005

(86) PCT No.: PCT/JP2005/008089
§ 371 (c)(1),
(2), (4) Date: Oct. 12, 2006

(87) PCT Pub. No.: WO2005/107330
PCT Pub. Date: Nov. 10, 2005

(65) Prior Publication Data
US 2007/0221933 A1 Sep. 27, 2007

(30) Foreign Application Priority Data
Apr. 28, 2004 (JP) ............... 2004-134915

(51) Int. Cl.
H01L 27/15 (2006.01)
H01L 31/12 (2006.01)
H01L 33/00 (2006.01)
H01L 31/072 (2006.01)

(52) U.S. Cl. ............... 257/79; 257/12; 257/94; 257/103

(58) Field of Classification Search ............ 257/12–18, 257/78–103, E33.072
See application file for complete search history.

(56) References Cited

U.S. PATENT DOCUMENTS 6,303,963 B1 10/2001 Ohtani et al.

(Continued)

FOREIGN PATENT DOCUMENTS

CN 1474633 2/2004

(Continued)

OTHER PUBLICATIONS

International Search report (Application No. PCT/JP2005/008089) Dated Sep. 27, 2005.

(Continued)

Primary Examiner—Cuong Q Nguyen
(74) Attorney, Agent, or Firm—Eric J. Robinson; Robinson Intellectual Property Law Office, P.C.

(57) ABSTRACT

It is an object of the present invention to provide a light-emitting element and a light-emitting device, in which a plurality of electroluminescent layers are stacked with a charge generation layer interposed therebetween between a pair of electrodes that are opposed to each other, and for which the charge generation layer can be formed on the electroluminescent layer by sputtering without damaging the electroluminescent layer. A material that is not easily etched is used for, of the electroluminescent layer, the closest layer to the charge generation layer formed by sputtering on the electroluminescent layer. Specifically, a benzoxazole derivative or a pyridine derivative is used.

11 Claims, 12 Drawing Sheets

U.S. PATENT DOCUMENTS

| | | |
|---|---|---|
| 6,914,269 B2 | 7/2005 | Nakamura |
| 2003/0127967 A1 | 7/2003 | Tsutsui et al. |
| 2004/0027059 A1 | 2/2004 | Tsutsui |
| 2004/0161192 A1 | 8/2004 | Hamano et al. |
| 2004/0251466 A1 | 12/2004 | Nakamura |
| 2004/0251467 A1 | 12/2004 | Nakamura |
| 2004/0265253 A1 | 12/2004 | Seo et al. |
| 2005/0012454 A1 | 1/2005 | Yamazaki et al. |
| 2005/0073247 A1 | 4/2005 | Yamazaki et al. |
| 2005/0147847 A1 | 7/2005 | Nakamura |
| 2005/0156197 A1 | 7/2005 | Tsutsui et al. |
| 2005/0248267 A1 | 11/2005 | Gyoutoku et al. |
| 2006/0091797 A1 | 5/2006 | Tsutsui et al. |
| 2006/0134840 A1 | 6/2006 | Ohtani et al. |
| 2006/0141645 A1 | 6/2006 | Yamazaki et al. |
| 2007/0085070 A1* | 4/2007 | Sakata ................... 257/13 |
| 2007/0235742 A1* | 10/2007 | Tobise et al. ............. 257/79 |
| 2008/0150420 A1 | 6/2008 | Tsutsui |

FOREIGN PATENT DOCUMENTS

| | | |
|---|---|---|
| EP | 1 318 553 | 6/2003 |
| EP | 1 388 904 | 2/2004 |
| EP | 1 486 551 | 12/2004 |
| EP | 1 487 029 | 12/2004 |
| JP | 2003-045676 | 2/2003 |
| JP | 2003-264085 | 9/2003 |
| JP | 2004-134395 | 4/2004 |
| JP | 2005-026220 | 1/2005 |
| JP | 2005-026221 | 1/2005 |
| WO | 2004/055897 | 7/2004 |
| WO | 2005/006460 | 1/2005 |

OTHER PUBLICATIONS

Written Opinion (Application No. PCT/JP2005/008089) Dated Sep. 27, 2005.

Matsumoto et al, *Multiphoton Emission OLED: Structure and Property*, IDW '03: Proceedings of the 10$^{th}$ International Display Workshops, 2003, pp. 1285-1288.

Office Action (Application No. 200580012658.3) Dated Jul. 11, 2008.

* cited by examiner

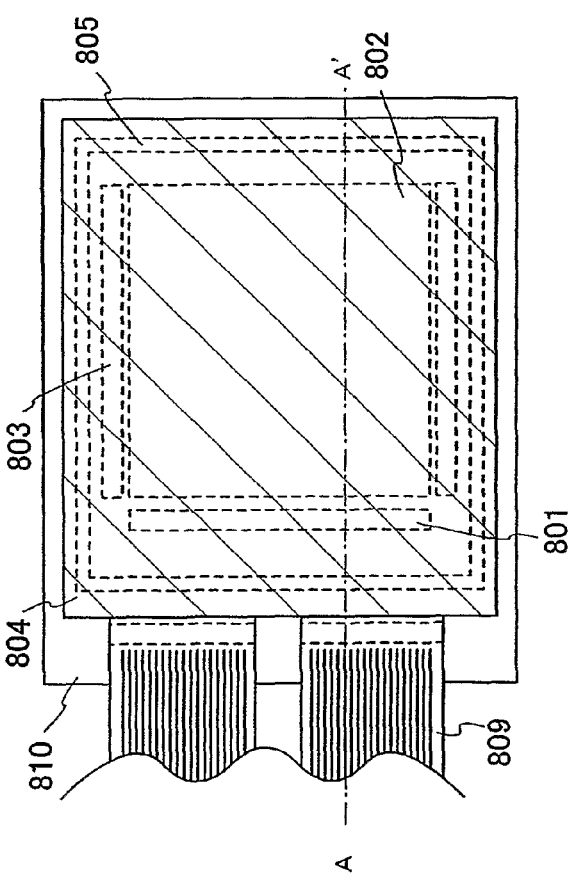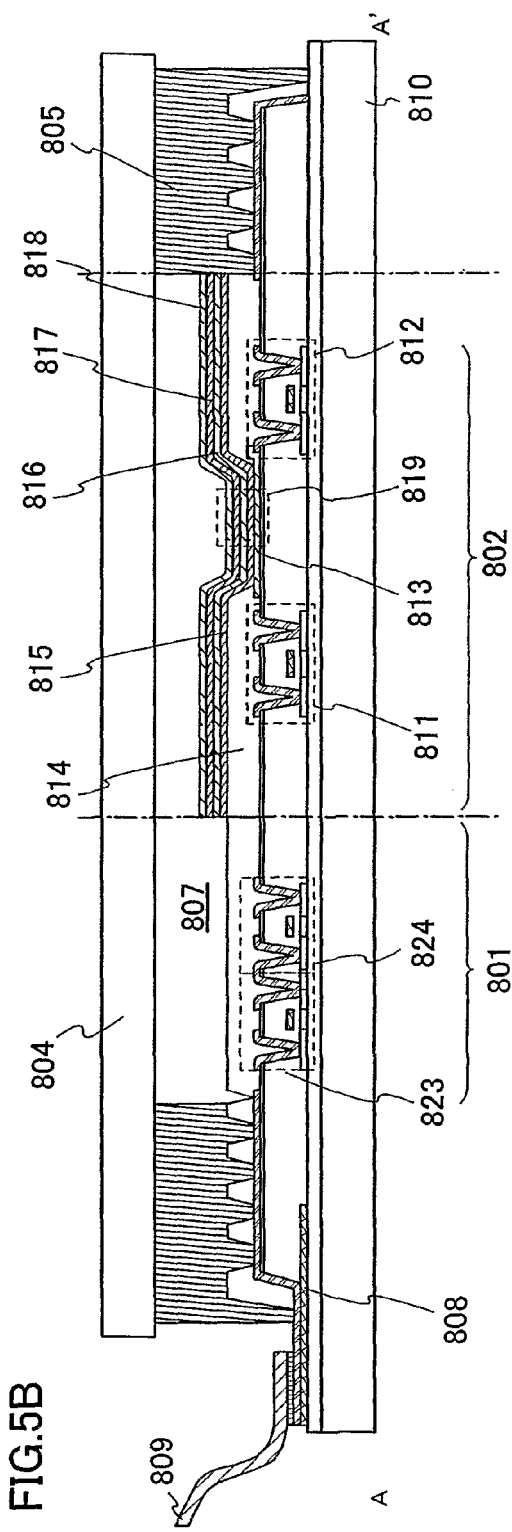
FIG.5A
FIG.5B

LIGHT-EMITTING ELEMENT AND METHOD OF MANUFACTURING THE SAME, AND LIGHT-EMITTING DEVICE USING THE LIGHT-EMITTING ELEMENT

TECHNICAL FIELD

The present invention relates to a light-emitting element and a method of manufacturing the light-emitting element, and a light-emitting device using the light-emitting element.

BACKGROUND ART

A light-emitting element using a luminescent material has features of thin shape and lightweight, high response speed, low direct-current voltage drive, and the like, and is expected to be applied to a next-generation flat panel display. A light-emitting device in which light-emitting elements are arranged in a matrix has superiority in wide viewing angle and high visibility as compared with conventional liquid crystal display devices.

The light emission mechanism of a light-emitting element is as follows: An electron injected from a cathode and a hole injected from an anode are recombined in the luminescence center in an electroluminescent layer to form a molecular exciton by applying a voltage to a pair of electrodes with the electroluminescent layer interposed therebetween, and energy is released to emit light when the molecular exciton returns to the ground state. An excited singlet state and an excited triplet state are known as an excited state, and it is believed that light can be emitted through either state.

As for such a light-emitting element, there are many problems related to materials in improving characteristics thereof. Therefore, improvement of an element structure, a development of a material, and the like are conducted in order to overcome these problems.

As one of the element structures, a light-emitting element is reported, which has a structure in which a plurality of luminescent units are stacked to be divided by a charge generation layer between an anode and a cathode that are opposed to each other in order to realize a longer lifetime when light is emitted with high luminance (Patent Document 1 and Non-Patent Document 1). The charge generation layer has the function of injecting carriers and is required to include a highly light-transmitting material.

[Patent Document 1]

Japanese Patent Laid Open Disclosure No.: 2003-45676

[Non-Patent Document 1]

Toshio Matsumoto, Takeshi Nakada, Jun Endo, Koichi Mori, Norihumi Kawamura, Akira Tokoi, and Junji Kido, IDW' 03, pp. 1285-1288

DISCLOSURE OF INVENTION

Problems to be Solved by the Invention

In Patent Document 1 and Non-Patent Document 1, a highly light-transmitting transparent conductive film is used as the charge generation layer. However, there is a problem that an electroluminescent layer is damaged (sputter damage) when a transparent conductive film typified by indium tin oxide (ITO) is formed on the electroluminescent layer by sputtering. In addition, when a transparent conductive film is formed by evaporation, transmittance and resistivity of an electrode to be formed is reduced, which is not preferable.

Therefore, it is desired to propose a light-emitting element and a light-emitting device for which an electrode can be formed on an electroluminescent layer by sputtering without damaging the electroluminescent layer.

In view of the problems described above, it is an object of the present invention to provide a method of manufacturing a light-emitting element, in which damage to an electroluminescent layer due to film formation by sputtering can be reduced. It is also an object of the present invention to provide a light-emitting element and a light-emitting device in which damage due to film formation by sputtering is reduced.

Means to Solve the Problems

A light-emitting element according to the present invention includes a plurality of (at least two) electroluminescent layers and one or a plurality of (at least one) charge generation layers between a first electrode and a second electrode. The electroluminescent layers and the charge generation layer are stacked alternately, and the each electroluminescent layer includes a layer containing a material that is not easily etched due to plasma in deposition by sputtering. Further, the electroluminescent layer and the charge generation layer are stacked so that the layer containing a material that is not easily etched in the electroluminescent layer is formed before the charge generation layer is formed.

Namely, of the electroluminescent layer, for a layer in contact with the charge generation layer formed on the electroluminescent layer by sputtering, a material that is not easily etched due to plasma in deposition by sputtering is used. More specifically, when the first electrode is formed before the second electrode, a layer containing a benzoxazole derivative or a pyridine derivative is formed on the first electrode side of the charge generation layer so as to come in contact with the charge generation layer.

Hereinafter, in the present specification, of a pair of electrodes of a light-emitting element, an electrode formed first is referred to as a first electrode, and an electrode formed later is referred to as a second electrode.

A general formula (1) shows the structure of a benzoxazole derivative that is used in the present invention.

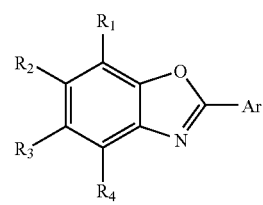

[Formula (1)]

(1)

(where Ar is an aryl group, R1 to R4 are independently hydrogen, halogen, a cyano group, an alkyl group having 1 to 10 carbon atoms, a haloalkyl group having 1 to 10 carbon atoms, or an alkoxyl group having 1 to 10 carbon atoms. Alternatively, R1 to R4 are a substituted or unsubstituted aryl group, or a substituted or unsubstituted heterocyclic group)

A general formula (2) shows the structure of a pyridine derivative that is used in the present invention.

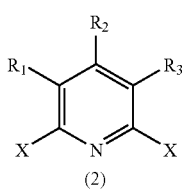

[Formula (2)]

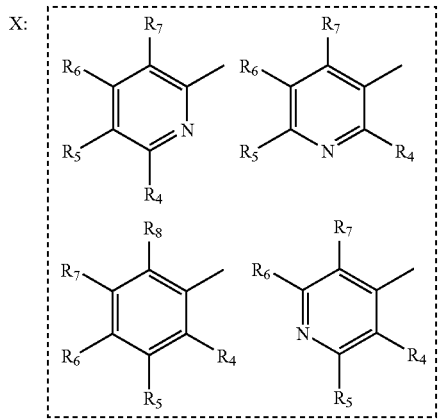

(where two Xs may have either the same structure or a different structure. R1 to R8 are independently hydrogen, halogen, a cyano group, an alkyl group having 1 to 10 carbon atoms, a haloalkyl group having 1 to 10 carbon atoms, or an alkoxyl group having 1 to 10 carbon atoms. Alternatively, R1 to R8 are a substituted or unsubstituted aryl group, or a substituted or unsubstituted heterocyclic group)

A light-emitting element according to the present invention includes a first electrode, a second electrode, and a plurality of electroluminescent layers that are stacked to be divided by a charge generation layer between the first electrode and the second electrode. In addition to a layer from which luminescence can be obtained actually (light-emitting layer), a layer containing a highly carrier (electron, hole) transporting material, a layer containing a highly carrier injecting material, and the like may be also combined to form each electroluminescent layer.

For example, when a cathode is the first electrode and an anode is the second electrode, the material that is not easily etched is used for a hole-injecting or hole-transporting layer which is the closest to the charge generation layer, of the electroluminescent layer. Specifically, when a benzoxazole derivative is used, for example, a layer containing any one or a plurality of materials of tetracyano-quinodimethan (hereinafter, referred to as TCQn), $FeCL_3$, fullerene (hereinafter, referred to as $C_{60}$), and tetrafluoro-tetracyano-quinodimethan (hereinafter, referred to as $F_4TCNQ$) in addition to the benzoxazole derivative is formed on the first electrode side of the charge generation layer so as to come in contact with the charge generation layer.

In addition, for example, when an anode is the first electrode and a cathode is the second electrode, the material that is not easily etched is used for an electron-injecting or electron transporting layer which is the closest to the charge generation layer, of the electroluminescent layer. Specifically, when a benzoxazole derivative is used, a layer containing any one or a plurality of materials of an alkali metal, an alkaline earth metal, and a transition metal in addition to the benzoxazole derivative is formed on the first electrode side of the charge generation layer so as to come in contact with the charge generation layer.

Even when a transparent conductive film formed by sputtering, for example, such as indium tin oxide (ITO), indium tin oxide containing silicon, or indium oxide containing zinc oxide (ZnO) at 2 to 20%, is used for the charge generation layer, sputter damage to the electroluminescent layer can be suppressed by the structure described above. Therefore, more materials can be used to form the charge generation layer.

In the present invention, even when a transparent conductive film formed by sputtering is used for the second electrode, sputter damage to the electroluminescent layer can be suppressed by forming the layer containing a material that is not easily etched due to plasma in deposition by sputtering as a layer in contact with the second electrode, of the electroluminescent layer.

It is to be noted that a light-emitting device according to the present invention is not limited to an active matrix type, and may be also a passive matrix type light-emitting device. Also, the present invention can be applied to a light-emitting element including only one electroluminescent layer.

EFFECT OF THE INVENTION

As described above, according to the present invention, a method of manufacturing a light-emitting element can be obtained, in which damage to an electroluminescent layer can be reduced when a charge generation layer or a second electrode is formed on an electroluminescent layer by sputtering. Moreover, this method makes it possible to provide a light-emitting element and a light-emitting device, in which defects due to film formation by sputtering are suppressed. Therefore, more materials can be used for a charge generation layer formed on an electroluminescent layer.

BRIEF DESCRIPTION OF DRAWINGS

In the accompanying drawings:

FIGS. 5A and 5B are diagrams showing an example of a light-emitting device using a light-emitting element according to the present invention.

BEST MODE FOR CARRYING OUT THE INVENTION

Although Embodiment Mode of the present invention is described in detail with reference to the accompanying drawings hereinafter, it is to be understood that the present invention is not limited to the following description, and various changes and modifications will be apparent to those skilled in the art unless such changes and modifications depart from the spirit and scope of the present invention. Therefore, the present invention should not be limited to the Embodiment Mode described hereinafter.

Figure 1:
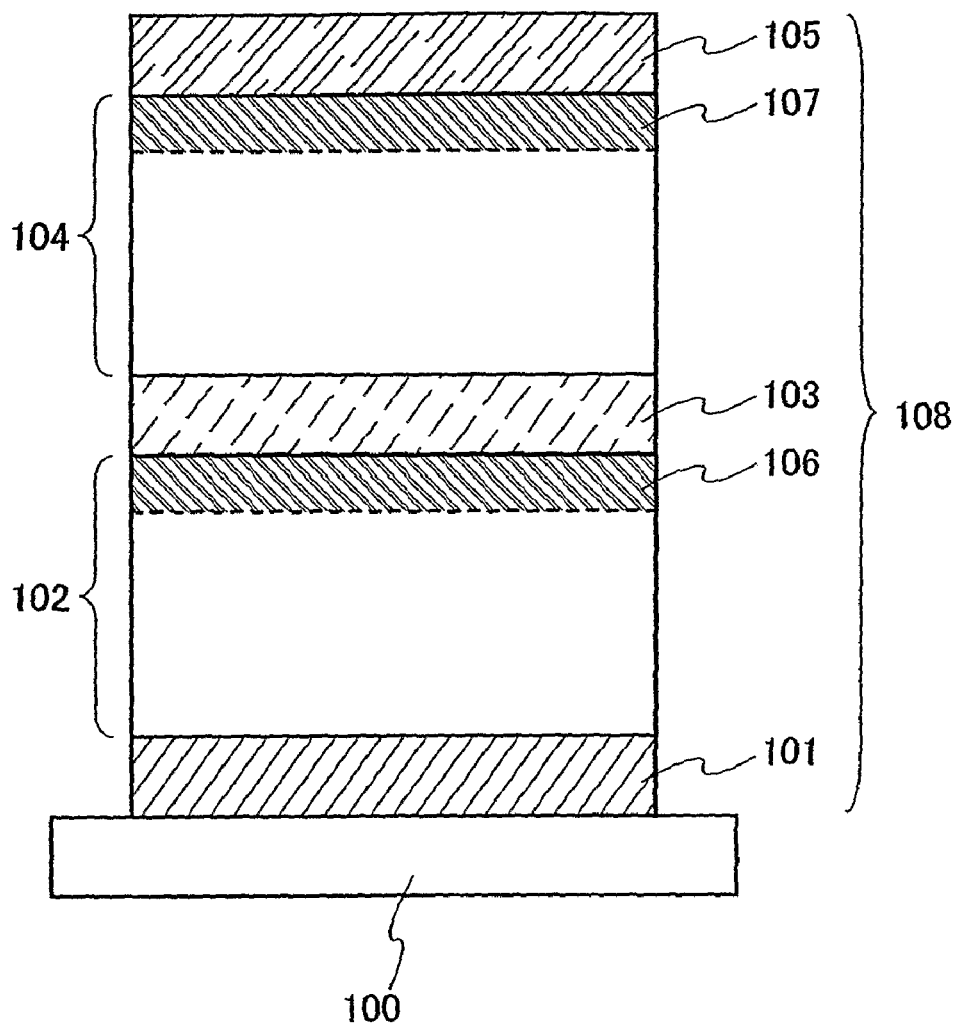
FIG. 1 is a diagram illustrating a light-emitting element according to the present invention.

The structure of a light-emitting element according to the present invention will be described with reference to FIG. 1. FIG. 1 schematically shows a structure of a light-emitting element according to the present invention. A light-emitting element 108 according to the present invention is formed over a substrate 100, and includes a plurality of electroluminescent layers stacked between a first electrode 101 and a second electrode 105 with a charge generation layer 103 interposed therebetween. It is to be noted that various layers and semiconductor elements are actually provided between the substrate 100 and the light-emitting element 108.

One of the first electrode 101 and the second electrode 105 corresponds to an anode and the other corresponds to a cathode. In the present invention, of an electroluminescent layer 102, a layer 106 which is the closest layer to the charge generation layer 103 formed on the electroluminescent layer 102, includes a material that is not easily etched due to plasma in deposition by sputtering, such as a benzoxazole derivative or a pyridine derivative. Specifically, when the first electrode 101 is an anode and the second electrode 105 is a cathode, the layer 106 which is the closest layer to the charge generation layer 103 includes any one or a plurality of materials of an alkali metal, an alkaline-earth metal and a transition metal in addition to the benzoxazole derivative so that the layer 106 has an electron injecting properties in the case of using the benzoxazole derivative.

On the other hand, when the first electrode 101 is a cathode and the second electrode 105 is an anode, the layer 106 which is the closest layer to the charge generation layer 103 includes any one or a plurality of materials of TCQn, $FeCl_3$, $C_{60}$ and $F_4TCNQ$ in addition to a benzoxazole derivative so that the layer 106 has a hole injecting properties in the case of using the benzoxazole derivative.

Further, when sputtering is used to form the second electrode 105 as in the case of the charge generation layer 103, the effect of suppressing sputter damage to the electroluminescent layer can be obtained by using the above-mentioned materials for a layer 107 which is the closest layer to the second electrode 105. Specifically, defects due to sputter damage can be suppressed by applying the present invention to a top emission type element in which the second electrode is formed by using a transparent conductive film and a dual emission type element in which the first electrode and the second electrode are formed by using a transparent conductive film.

The electroluminescent layer 102 (104) includes at least a light-emitting layer and the layer 106 (107) containing a material that is not easily etched due to plasma in deposition by sputtering. In addition to the light-emitting layer and the layer 106 (107), a hole injecting layer, a hole transporting layer, a hole blocking layer, an electron transporting layer, an electron injecting layer, and the like are appropriately combined to construct the electroluminescent layer 102 (104), and the layer containing the material that is not easily etched may also serve as those layers. The electroluminescent layer 102 (104) may have a single layer structure or a stacked structure of a plurality of layers.

As a first structure of the present invention, a layer containing a material that is not easily etched due to plasma in deposition by sputtering includes a benzoxazole derivative represented by the following general formula (1), and is provided in contact with a charge generation layer.

[Formula (1)]

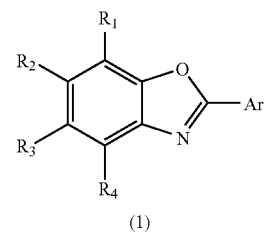

(1)

(where Ar is an aryl group, R1 to R4 are independently hydrogen, halogen, a cyano group, an alkyl group having 1 to 10 carbon atoms, a haloalkyl group having 1 to 10 carbon atoms, or an alkoxyl group having 1 to 10 carbon atoms. Alternatively, R1 to R4 are a substituted or unsubstituted aryl group, or a substituted or unsubstituted heterocyclic group)

As specific materials included in the benzoxazole derivative represented by the general formula (1), materials represented by structural formulas (3) to (5) can be given.

[Formula (3)]

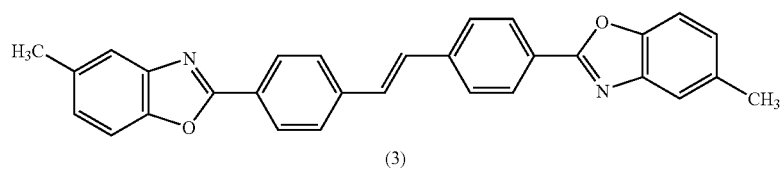

(3)

[Formula (4)]

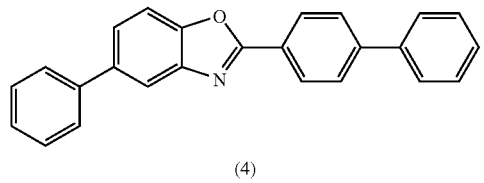

(4)

[Formula (5)]

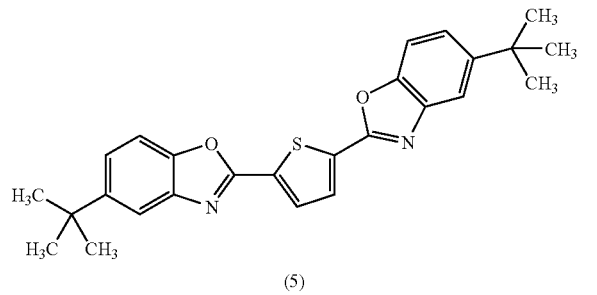

(5)

As another structure of the present invention, a layer containing a material that is not easily etched due to plasma in deposition by sputtering includes a pyridine derivative represented by the following general formula (2), and is provided in contact with a charge generation layer.

[Formula (2)]

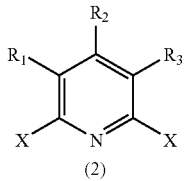

(2)

X:

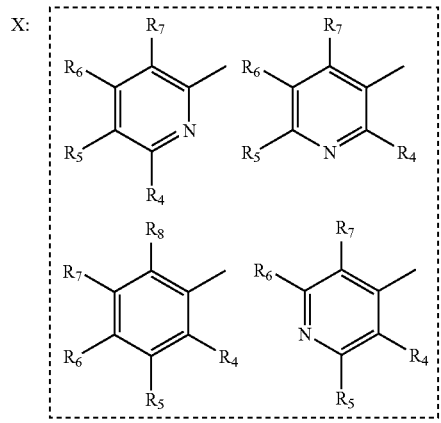

(where two Xs may have either the same structure or a different structure. R1 to R8 are independently hydrogen, halogen, a cyano group, an alkyl group having 1 to 10 carbon atoms, a haloalkyl group having 1 to 10 carbon atoms, or an alkoxyl group having 1 to 10 carbon atoms. Alternatively, R1 to R8 are a substituted or unsubstituted aryl group, or substituted or unsubstituted heterocyclic group).

As specific materials included in the pyridine derivative represented by the general formula (2), materials represented by structural formulas (6) to (9) can be given.

[Formula (6)]

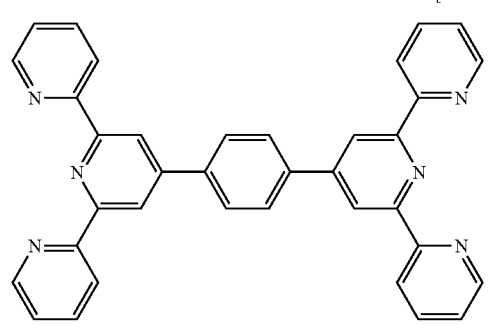

(6)

[Formula (7)]

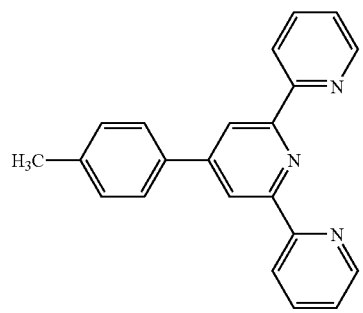

(7)

[Formula (8)]

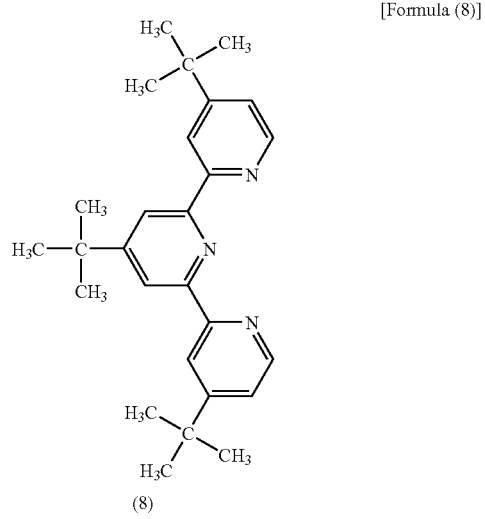

(8)

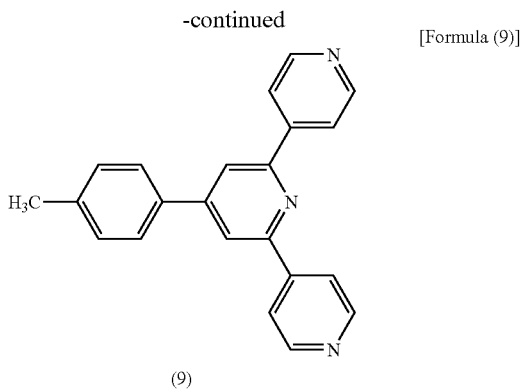

[Formula (9)]

(9)

In the light-emitting element according to the present invention, light generated by recombination of carriers in the electroluminescent layers 102 and 104 is emitted from both the first electrode 101 and the second electrode 105 to the outside. Namely, both electrodes are formed by using a transparent conductive film.

Known materials can be used for the electroluminescent layers 102 and 104, and any low molecular weight materials and high molecular weight materials can be also used. A material forming the electroluminescent layers 102 and 104 may include only an organic compound material, or include partially an inorganic compound material in addition to an organic compound.

Specific materials to be used for a hole injecting layer, a hole transporting layer, a light-emitting layer or an electron transporting layer constituting the electroluminescent layers 102 and 104 formed between the pair of electrodes in the present invention are shown below.

As a hole injecting material forming a hole injecting layer, a porphyrin compound is effective among organic compounds, and phthalocyanine (hereinafter, referred to as $H_2$-Pc), copper phthalocyanine (hereinafter, referred to as Cu-Pc), and the like can be used. In addition, a material obtained by chemical doping to a conductive high molecular weight compound such as polyethylene dioxythiophene (hereinafter, referred to as PEDOT) doped with polystyrene sulfonate (hereinafter, referred to as PSS), and the like can be used. A material containing a benzoxazole derivative and any one or a plurality of materials of TCQn, $FeCl_3$, $C_{60}$ and $F_4$TCNQ may be also used.

As a hole transporting material forming a hole transporting layer, an aromatic amine compound (namely, a compound having a bond of benzene ring-nitrogen) is suitable. As materials that are used broadly, for example, N,N'-bis(3-methylphenyl)-N,N'-diphenyl-[1,1'-biphenyl]-4,4'-diamine (hereinafter, referred to as TPD), 4,4'-bis[N-(1-naphthyl)-N-phenyl-amino]-biphenyl (hereinafter, referred to as α-NPD) which is a derivative thereof, starburst aromatic amine compounds such as 4,4',4"-tris(N-carbazolyl)-triphenylamine (hereinafter, referred to as TCTA), 4,4',4"-tris(N,N-diphenyl-amino)-triphenylamine (hereinafter, referred to as TDATA), and 4,4',4"-tris[N-(3-methylphenyl)-N-phenyl-amino]-triphenylamine (hereinafter, referred to as MTDATA), and the like can be given.

As a luminescent material forming a light-emitting layer, specifically, metal complexes such as tris(8-quinolinolato) aluminum (hereinafter, referred to as $Alq_3$), tris(4-methyl-8-quinolinolato)aluminum (hereinafter, referred to as $Almq_3$), bis(10-hydroxybenzo[h]-quinolinato) beryllium (hereinafter, referred to as $BeBq_2$), bis(2-methyl-8-quinolinolato)-(4-hydroxy-biphenyl)-aluminum (hereinafter, referred to as BAlq), bis[2-(2-hydroxyphenyl)-benzoxazolate]zinc (hereinafter, referred to as $Zn(BOX)_2$), bis[2-(2-hydroxyphenyl)-benzothiazorato]zinc (hereinafter, referred to as $Zn(BTZ)_2$), and various fluorescent pigments are effective.

When a light-emitting layer is formed by combining with a guest material, quinacridone, diethyl quinacridone (hereinafter, referred to as DEQD), dimethyl quinacridone (hereinafter, referred to as DMQD), rubrene, perylene, coumarin, coumarin545T (hereinafter, referred to as C545T), DPT, Co-6, PMDFB, BTX, ABTX, DCM, DCJT, and triplet luminescent materials (phosphorescent materials) such as tris(2-phenylpyridine)iridium (hereinafter, referred to as $Ir(ppy)_3$), 2,3,7,8,12,13,17,18-octaethyl-21H,23H-porphyrin-platinum (hereinafter, referred to as PtOEP) can be used as the guest material.

As an electron transporting material forming an electron transporting layer, a metal complex having a quinoline skeleton or benzoquinoline skeleton such as $Alq_3$, $Almq_3$ and $BeBq_2$ described above, and BAlq that is a mixed ligand complex is suitable. A metal complex having an oxazole ligand such as $Zn(BOX)_2$, or a thiazole ligand such as $Zn(BTZ)_2$ can be also used. Moreover, in addition to the metal complex, oxadiazole derivatives such as 2-(4-biphenyl)-5-(4-tert-butylphenyl)-1,3,4-oxadiazole (hereinafter, referred to as PBD), and 1,3-bis[5-(p-tert-butylphenyl)-1,3,4-oxadiazol-2-yl]benzene (hereinafter, referred to as OXD-7), or triazole derivatives such as 3-(4-tert-butylphenyl)-4-phenyl-5-(4-biphenylil)-1,2,4-triazole (hereinafter, referred to as TAZ), and 3-(4-tert-butylphenyl)-4-(4-ethylphenyl)-5-(4-biphenylil)-1,2,4-triazole (hereinafter, referred to as p-EtTAZ) can be also used.

As an electron injecting material forming an electron injecting layer, specifically, an insulating thin film, for example, an alkali metal halide such as LiF or CsF, an alkaline earth halide such as $CaF_2$, or an alkali metal oxide such as $Li_2O$ is often used. Further, alkali metal complexes such as lithium acetyl acetonate (abbreviation: Li(acac)), and 8-quinolinolato-lithium (abbreviation: Liq) are also effective. A material containing a benzoxazole derivative and any one or a plurality of materials of an alkali metal, an alkaline earth metal and a transition metal may be also used.

FIG. 1 shows a structure including two electroluminescent layers; however, the structure is not limited thereto and a structure including three or more layers may be also used. It is not necessary that stacked electroluminescent layers have the same structure, and electroluminescent layers constituted by different materials may be also stacked.

Embodiment 1

Figure 2:
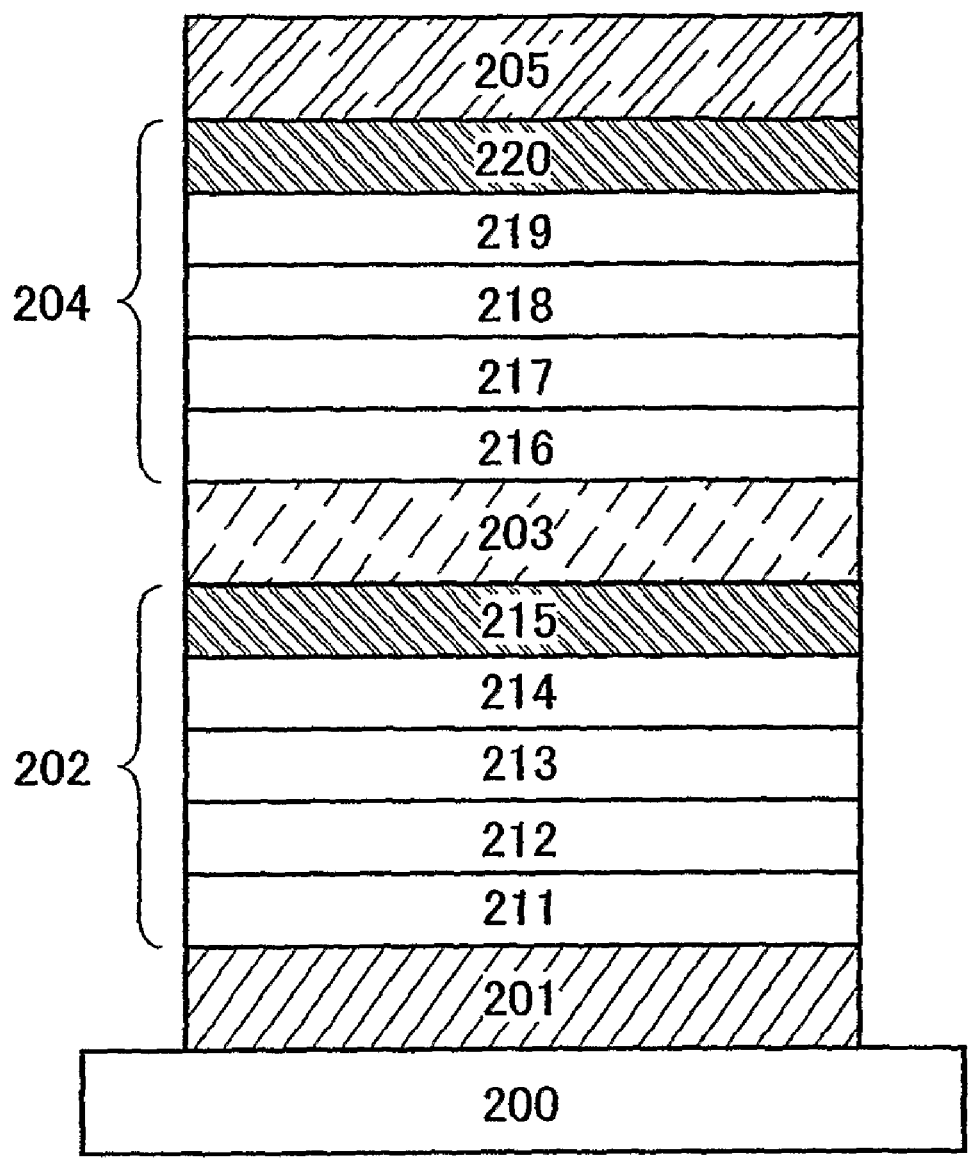
FIG. 2 is a diagram illustrating a light-emitting element according to the present invention.

In the present embodiment, an example in which a first electrode is an anode and a second electrode is a cathode will be described with reference to FIG. 2.

First, a first electrode 201 for a light-emitting element is formed over a substrate 200. It is to be noted that the first electrode 201 serves as an anode in the present embodiment. ITO that is a transparent conductive film is used as a material to form the first electrode 201 with a film thickness of 110 nm by sputtering.

Next, an electroluminescent layer 202 is formed on the first electrode 201 which serves as an anode. The electroluminescent layer 202 in the present embodiment has a stacked structure of a hole injecting layer 211, a hole transporting layer 212, a light-emitting layer 213, an electron transporting layer 214, and an electron injecting layer 215.

The substrate with the first electrode 201 formed thereover is fixed in a substrate holder of a commercially available vacuum evaporation system with the surface with the first electrode 201 downside. Then, copper phthalocyanine (hereinafter, referred to as Cu-Pc) is put in an evaporation source provided inside the vacuum evaporation system to form the hole injecting layer 211 with a film thickness of 20 nm by evaporation using a resistance heating method. Known hole injecting materials can be used as a material forming the hole injecting layer 211.

The hole transporting layer 212 is formed by using a highly hole-transporting material. Known hole transporting materials can be used for a material forming the hole transporting layer 212. In the present embodiment, 4,4'-bis[N-(1-naphthyl)-N-phenyl-amino]-biphenyl (hereinafter, referred to as α-NPD) is used to form the hole transporting layer 212 with a film thickness of 40 nm by the same method.

Then, the light-emitting layer 213 is formed. Luminescence is generated by recombination of a hole and an electron in the light-emitting layer 213. In the present embodiment, as for materials forming the light-emitting layer 213, tris(8-quinolinolato)aluminum (hereinafter, referred to as $Alq_3$) which is a host material and dimethylquinacridone (hereinafter, referred to as DMQD) which is a guest material are used, and the light-emitting layer 213 with a film thickness of 40 nm is formed by co-evaporation so that DMQD is contained at 1 weight %.

The electron transporting layer 214 is then formed. Known electron transporting materials can be used for a material forming the electron transporting layer 214. In the present embodiment, $Alq_3$ is used to form the electron transporting layer 214 with a film thickness of 20 nm by evaporation.

Next, the electron injecting layer 215 is formed. The electron injecting layer 215 is formed by using a benzoxazole derivative represented by the general formula (1). This step makes it possible to promote electron injection from a charge generation layer or an electrode into an electroluminescent layer, and suppress damage to an electroluminescent layer from formation of a charge generation layer or an electrode. Specifically, with the use of the benzoxazole derivative represented by the general formula (1), a layer containing the benzoxazole derivative and any one of an alkali metal, an alkaline earth metal, and a transition metal is formed in order to improve the electron injecting properties. In the present embodiment, the electron injecting layer 215 is formed to have a film thickness of 20 nm by co-evaporation with the use of 4,4'-Bis(5-methyl benzoxazol-2-yl)stilbene represented by the following structural formula (3) and Li which is an alkali metal so that Li is contained at 1 weight %.

Thus, after the electroluminescent layer 202 is formed by stacking the hole injecting layer 211, the hole transporting layer 212, the light-emitting layer 213, the electron transporting layer 214, and the electron injecting layer 215 (a layer containing a material that is not easily etched due to plasma in deposition by sputtering), a charge generation layer 203 is formed by sputtering. It is preferable that the charge generation layer 203 includes a light-transmitting material, and in the present embodiment, ITO (10 nm) is formed on the electroluminescent layer 202 by sputtering to obtain the charge generation layer 203.

An electroluminescent layer 204 is formed on the charge generation layer 203. The electroluminescent layer 204 may be formed in the same way as the electroluminescent layer 202 described above. In the present embodiment, Cu-Pc (20 nm) as a hole injecting layer 216, α-NPD (40 nm) as a hole transporting layer 217, $Alq_3$ (40 nm) containing DMQD at 1 weight % as a light-emitting layer 218, $Alq_3$ (20 nm) as an electron transporting layer 219, and a benzoxazole derivative (20 nm) containing Li at 1 weight % as an electron injecting layer 220 (a layer containing a material that is not easily etched due to plasma in deposition by sputtering), are formed.

Then, after the electroluminescent layer 204 is formed, ITO with a film thickness of 110 nm is formed by sputtering as a second electrode 205 which serves as a cathode.

In the light-emitting element manufactured in the present embodiment, of the electroluminescent layer, the closest layer to the charge generation layer is formed so as to contain a material that is not easily etched due to plasma in deposition by sputtering. Therefore, damage to the electroluminescent layer in deposition by sputtering can be reduced. It is to be noted that the same advantage can be obtained in the case of using a pyridine derivative in addition to the case of using a benzoxazole derivative.

An experiment is conducted in order to confirm that damage to an electroluminescent layer can be reduced, when, of the electroluminescent layer, the closest layer to a transparent conductive film formed by sputtering contains a material that is not easily etched.

On ITO which is a first electrode, Cu-Pc (20 nm) as a hole injecting layer, α-NPD (40 nm) as a hole transporting layer, $Alq_3$ (40 nm) containing DMQD at 1 weight % as a light-emitting layer, and $Alq_3$ (20 nm) as an electron transporting layer are formed. Then, an electron injecting layer is formed by using Li which is an alkali metal and 4,4'-Bis(5-methyl benzoxazol-2-yl)stilbene (20 nm) represented by the structural formula (3) so that Li is contained at 1 weight %. After that, ITO (110 nm) is formed by sputtering. An element manufactured in this experiment is referred to as an element 1.

Comparative Example 1

As Comparative Example 1, an element is manufactured, in which a material that is not easily etched due to plasma in

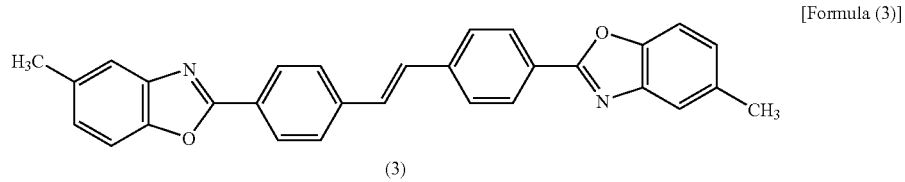

[Formula (3)]

(3)

deposition by sputtering is not used for, of an electroluminescent layer, the closest layer to a transparent conductive film formed by sputtering.

On ITO which is a first electrode, 4,4'-Bis(5-methyl benzoxazol-2-yl)stilbene (20 nm) represented by the structural formula (3) containing Li at 1 weight % as an electron injecting layer, Alq₃ (20 nm) as an electron transporting layer, Alq₃ (40 nm) containing DMQD at 1 weight % as a light-emitting layer, α-NPD (40 nm) as a hole transporting layer, and Cu-Pc (20 nm) as a hole injecting layer are formed. Thereafter, ITO (110 nm) is formed by sputtering. An element manufactured in the present comparative example is referred to as an element 2.

Comparative Example 2

As Comparative Example 2, an element is manufactured, in which a material that is not easily etched due to plasma in deposition by sputtering is not used for, of an electroluminescent layer, the closest layer to a transparent conductive film formed by sputtering. The element manufactured in the present comparative example is formed in the same way as the element manufactured in Comparative Example 1 until α-NPD is formed, and Cu-Pc is formed to have a film thickness of 40 nm as a hole injecting layer. Thereafter, ITO (110 nm) is formed by sputtering. An element manufactured in the present comparative example is referred to as an element 3.

Figure 6:
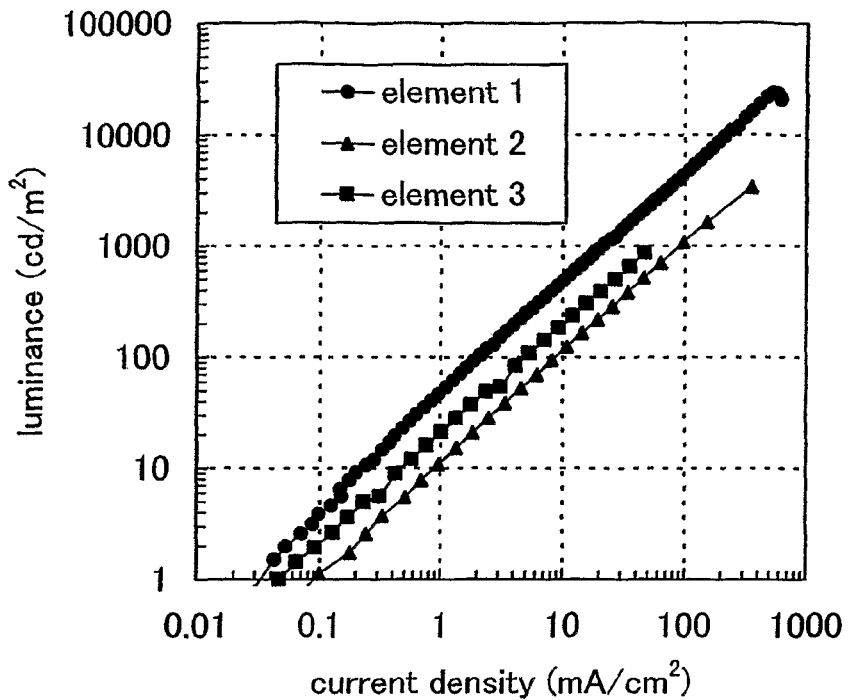
FIG. 6 is a diagram showing luminance-current density characteristics.
Figure 7:
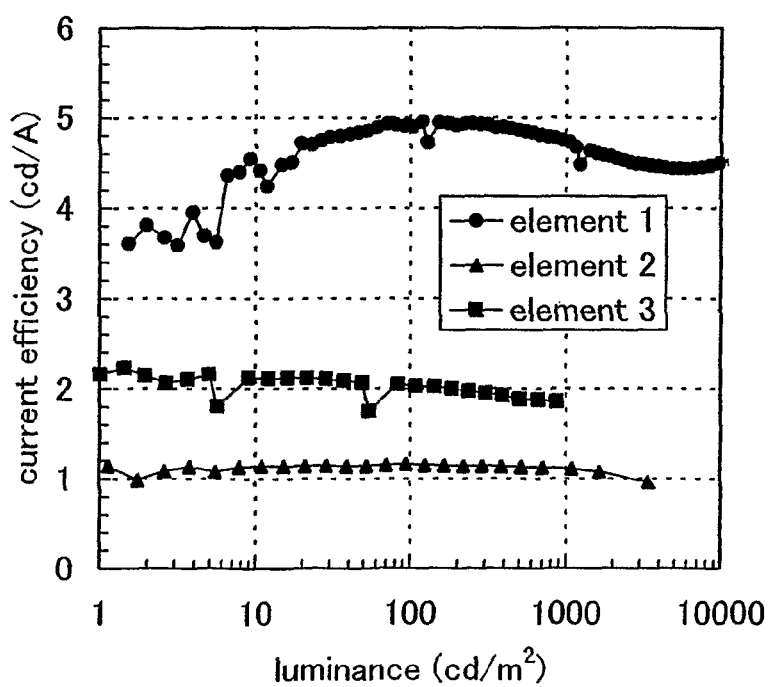
FIG. 7 is a diagram showing current efficiency-luminance characteristics.
Figure 8:
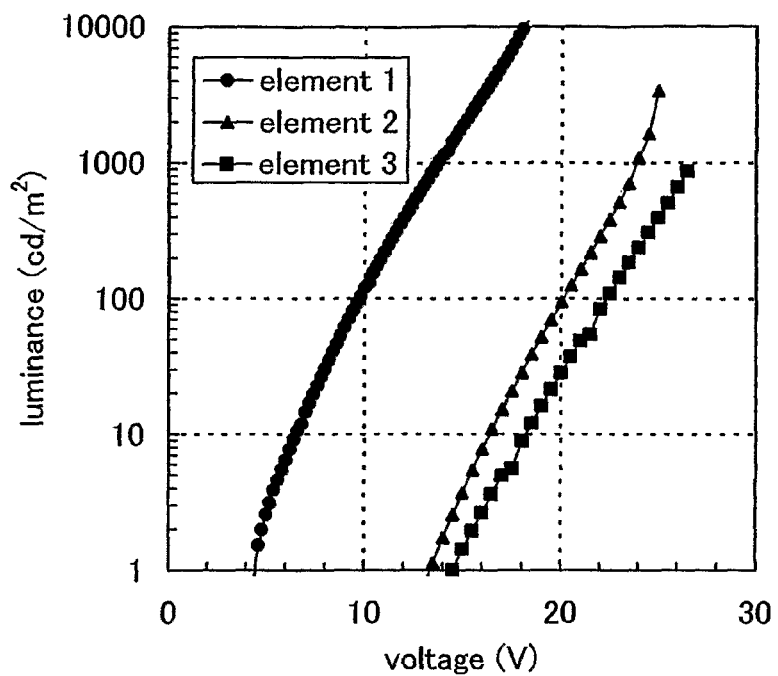
FIG. 8 is a diagram showing luminance-voltage characteristics.
Figure 9:
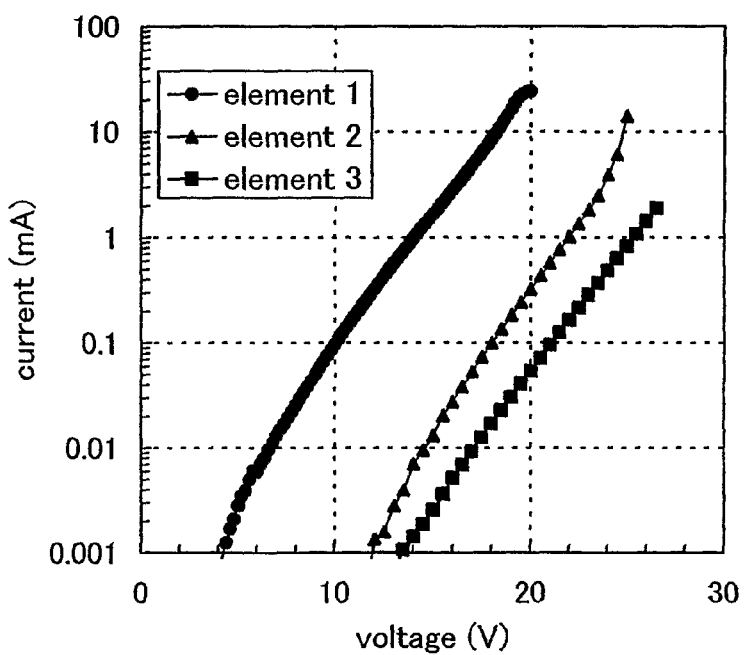
FIG. 9 is a diagram showing current-voltage characteristics.

FIG. 6 shows luminance-current density characteristics of the elements 1, 2 and 3, FIG. 7 shows current efficiency-luminance characteristics thereof, FIG. 8 shows luminance-voltage characteristics thereof, and FIG. 9 shows current-voltage characteristics thereof. As is apparent from FIGS. 6 to 9, the element 1 has favorable element characteristics compared with the elements 2 and 3.

The structure of the light-emitting element manufactured in Embodiment 1 includes the structure of the element 1. It is confirmed that the light-emitting element manufactured in Embodiment 1 also has the advantage that sputter damage to the electroluminescent layer is prevented by using a material that is not easily etched due to plasma in deposition by sputtering.

Embodiment 2

Figure 3:
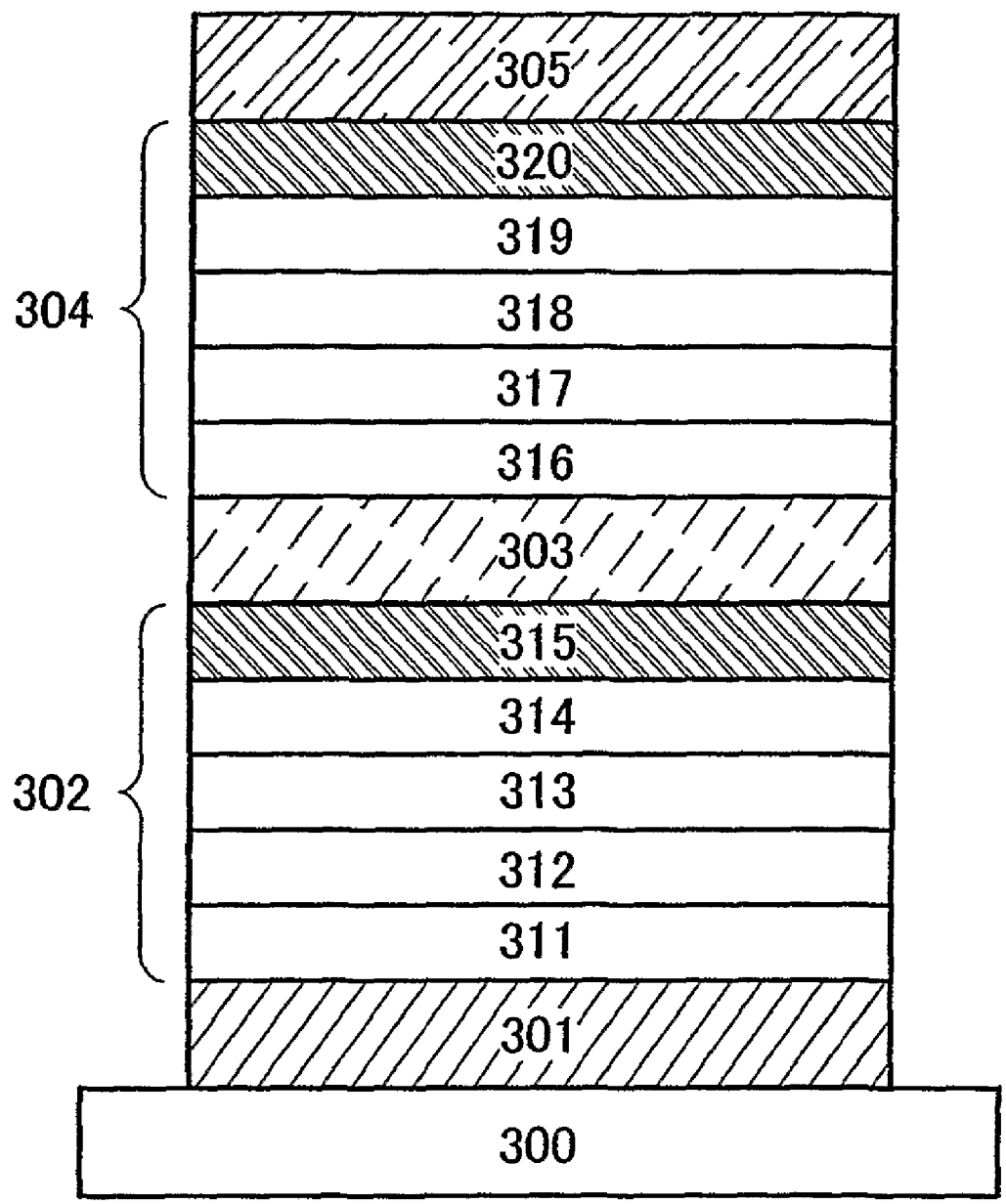
FIG. 3 is a diagram illustrating a light-emitting element according to the present invention.

In the present embodiment, an example in which a first electrode is a cathode and a second electrode is an anode will be described with reference to FIG. 3.

First, a first electrode 301 for a light-emitting element is formed over a substrate 300. It is to be noted that the first electrode 301 serves as a cathode in the present embodiment. ITO that is a transparent conductive film is used as a material, and the first electrode 301 with a film thickness of 110 nm is formed by sputtering.

Next, an electroluminescent layer 302 is formed on the first electrode 301 to serve as a cathode. The electroluminescent layer 302 in the present embodiment has a stacked structure of an electron injecting layer 311, an electron transporting layer 312, a light-emitting layer 313, a hole transporting layer 314, and a hole injecting layer 315.

On the first electrode 301, the electron injecting layer 311 is formed by using a highly electron-injecting material. Known electron injecting materials can be used as a material forming the electron injecting layer 311. In the present embodiment, a benzoxazole derivative and Li which is an alkali metal are used, and the electron injecting layer 311 with a film thickness of 20 nm is formed by co-evaporation so that Li is contained at 1 weight %.

Then, the electron transporting layer 312 is formed. Known electron transporting materials can be used for a material forming the electron transporting layer 312. In the present embodiment, Alq₃ is used, and the electron transporting layer 312 with a thickness of 20 nm is formed by evaporation.

The light-emitting layer 313 is then formed. Luminescence is generated by recombination of a hole and an electron in the light-emitting layer 313. In the present embodiment, Alq₃ which is a host material and DMQD which is a guest material among materials forming the light-emitting layer 313 are used, and the light-emitting layer 313 with a film thickness of 40 nm is formed by co-evaporation so that DMQD is contained at 10 weight %.

Then, the hole transporting layer 314 is formed by using a highly hole transporting material. Known hole transporting materials can be used as a material forming the hole transporting layer 314. In the present embodiment, α-NPD with a film thickness of 40 nm is formed by evaporation.

Next, the hole injecting layer 315 is formed. The hole injecting layer 315 is formed by using a benzoxazole derivative represented by the general formula (1). This step makes it possible to promote hole injection from a charge generation layer or an electrode into an electroluminescent layer, and suppress damage to an electroluminescent layer from formation of a charge generation layer or an electrode. Specifically, with the use of the benzoxazole derivative represented by the general formula (1), a layer containing the benzoxazole derivative and any one or a plurality of TCQn, FeCl₃, C₆₀, and F₄TCNQ is formed in order to improve the hole injecting properties. In the present embodiment, a layer containing 4,4'-Bis(5-methyl benzoxazol-2-yl)stilbene represented by the following structural formula (3) and TCQn with a film thickness of 20 nm is formed by co-evaporation.

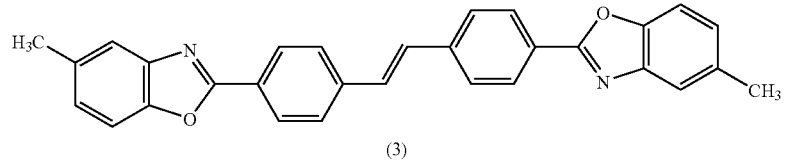

[Formula (3)]

(3)

Thus, after the electroluminescent layer 302 is formed by stacking the electron injecting layer 311, the electron transporting layer 312, the light-emitting layer 313, the hole transporting layer 314, and the hole injecting layer 315, a charge generation layer 303 is formed by sputtering. It is preferable that the charge generation layer 303 includes a light-transmitting material, and in the present embodiment, ITO (10 nm) is formed on the electroluminescent layer 302 by sputtering to obtain the charge generation layer 303.

An electroluminescent layer 304 is formed on the charge generation layer 303. The electroluminescent layer 304 is formed in the same way as the electroluminescent layer 302 described above. In the present embodiment, a benzoxazole derivative (20 nm) containing Li at 1 weight % as an electron injecting layer 316, Alq$_3$ (20 nm) as an electron transporting layer 317, Alq$_3$ (40 nm) containing DMQD at 1 weight % as a light-emitting layer 318, α-NPD (40 nm) as a hole transporting layer 319, and a layer containing a benzoxazole derivative and TCQn (20 nm) as a hole injecting layer 320, are formed.

Then, after the electroluminescent layer 304 is formed, ITO with a film thickness of 110 nm is formed by sputtering as a second electrode 305 which serves as an anode.

In the light-emitting element manufactured in the present embodiment, of the electroluminescent layer, the closest layer to the charge generation layer is formed so as to contain a material that is not easily etched due to plasma in deposition by sputtering. Therefore, damage to the electroluminescent layer in film formation by sputtering can be reduced. It is to be noted that the same advantage can be obtained in the case of using a pyridine derivative in addition to the case of using a benzoxazole derivative.

Embodiment 3

In the present embodiment, the structure of a light-emitting device using light-emitting elements manufactured in Embodiments 1 and 2 will be described with reference to FIG. 4 and FIGS. 11A to 14.

In a light-emitting device using a light-emitting element in which a plurality of electroluminescent layers are stacked, for example, when white luminescence is intended to be obtained, an electroluminescent layer for a first color (e.g. an electroluminescent layer for emitting red light), an electroluminescent layer for a second color (e.g. an electroluminescent layer for emitting green light), and an electroluminescent layer for a third color (e.g. an electroluminescent layer for emitting blue light) are stacked in the same sequence in each light-emitting element conventionally. However, when all the light-emitting elements have the same stacked structure, it is necessary that white luminescence is obtained from all light-emitting elements, and it is difficult to control depending on the interference effect of light and difference in resistance value of each layer in order to obtain uncolored white luminescence. Namely, it is necessary to control the thickness of each layer and the like strictly in order to obtain desired luminescent color. Moreover, change in characteristics with time is different depending on each luminescent material, and therefore, luminescence is not white any more after a certain period of time and luminescence of a certain color sometimes stands out. When all the elements have the same stacked structure, it is not possible to deal with change in luminescent color due to change in characteristics with time.

Figure 4:
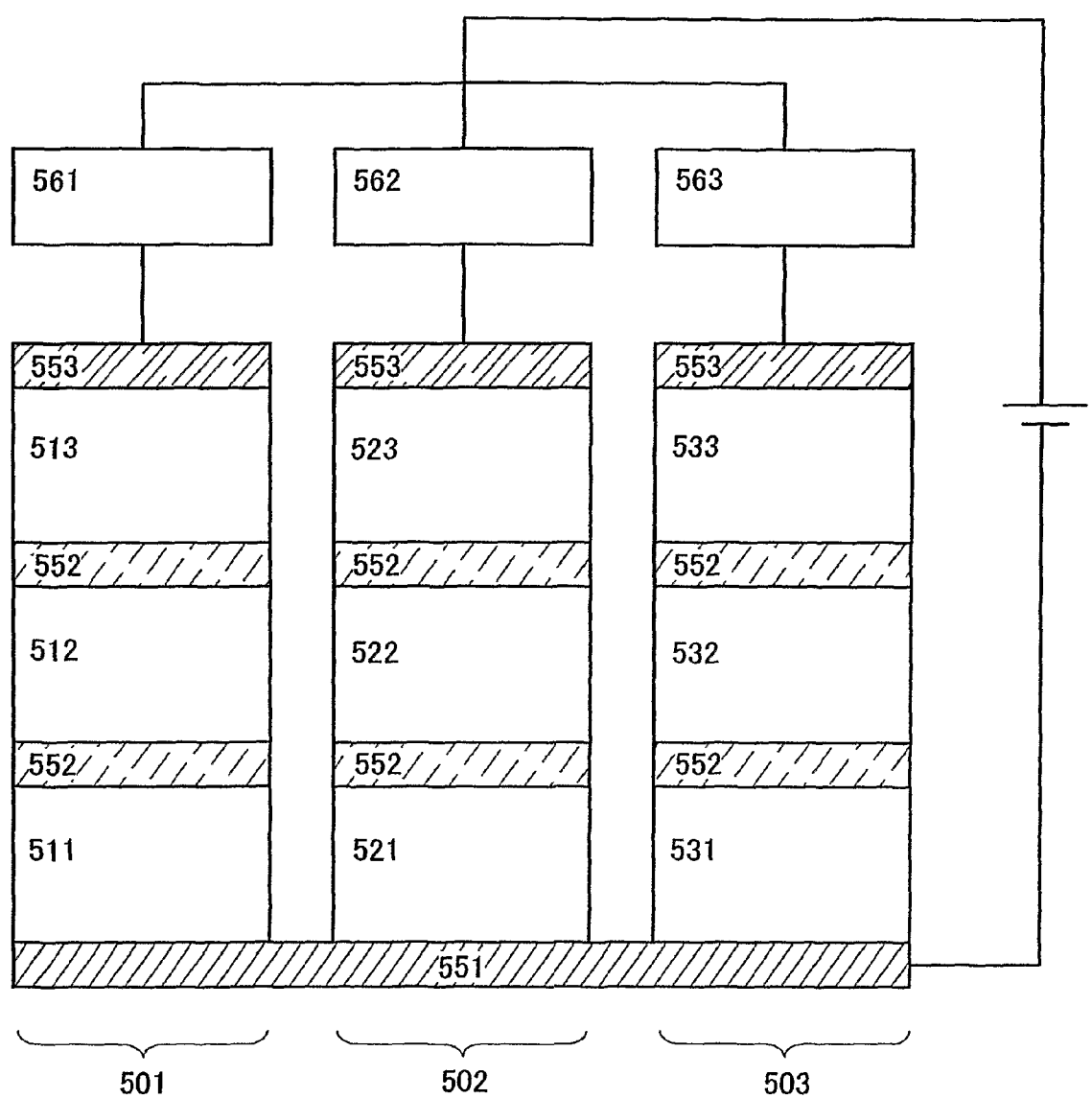
FIG. 4 is a diagram illustrating a light-emitting device according to the present invention for obtaining white luminescence.
Figure 11A:
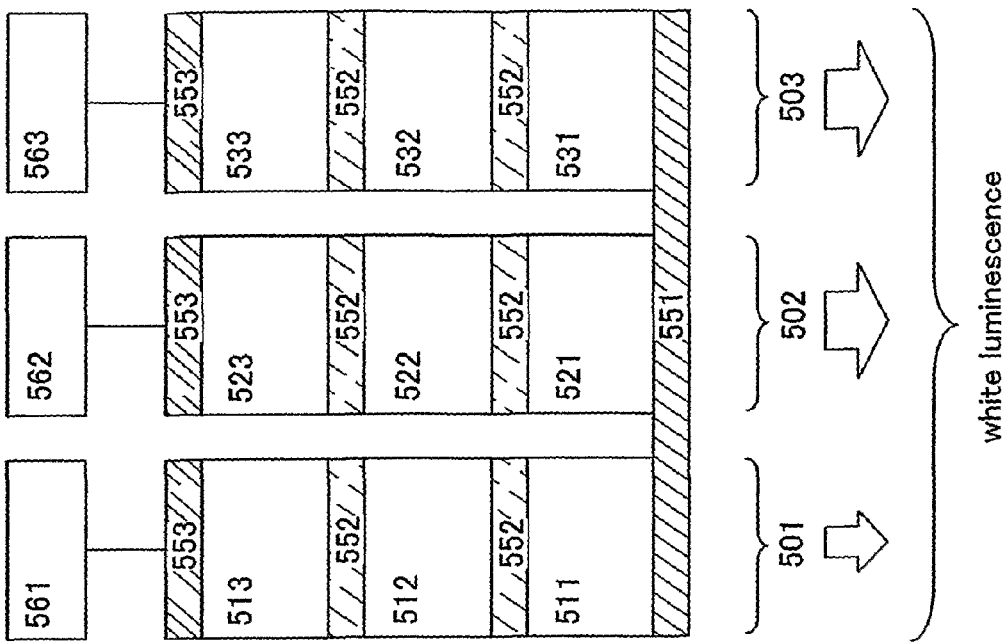
FIGS. 11A and 11B are diagrams illustrating a light-emitting device according to the present invention for obtaining white luminescence.

Consequently, in the present embodiment, white luminescence is obtained by using a stacked structure for each light-emitting element as shown in FIG. 4 and FIG. 11A. In FIG. 4 and FIG. 11A, three light-emitting elements (501, 502 and 503) are formed over a substrate, and these three light-emitting elements form one pixel. In each light-emitting element, electroluminescent layers are stacked over a first electrode 551 with a charge generation layer 552 interposed therebetween, and a second electrode 553 is formed as the top layer.

An electroluminescent layer 511 for a first color, an electroluminescent layer 512 for a second color, and an electroluminescent layer 513 for a third color are stacked in this order in the light-emitting element 501; an electroluminescent layer 521 for the second color, an electroluminescent layer 522 for the third color, and an electroluminescent layer 523 for the first color are staked in this order in the light-emitting element 502; and an electroluminescent layer 531 for the third color, an electroluminescent layer 532 for the first color, and an electroluminescent layer 533 for the second color are stacked in this order in the light-emitting element 503. As described above, the stacking sequence of the electroluminescent layers of each light-emitting element is made different so that white luminescence can be obtained as a whole pixel even when white luminescence cannot be obtained in each light-emitting element. The first color is strongly emitted in the light-emitting element 501, the second color is strongly emitted in the light-emitting element 502 and the third color is strongly emitted in the light-emitting element 503.

Since each light-emitting element can be driven independently in the case of an active matrix type, it becomes possible to deal with change in characteristics of each luminescent material with time so that white light can be emitted for a longer time.

Figure 11B:
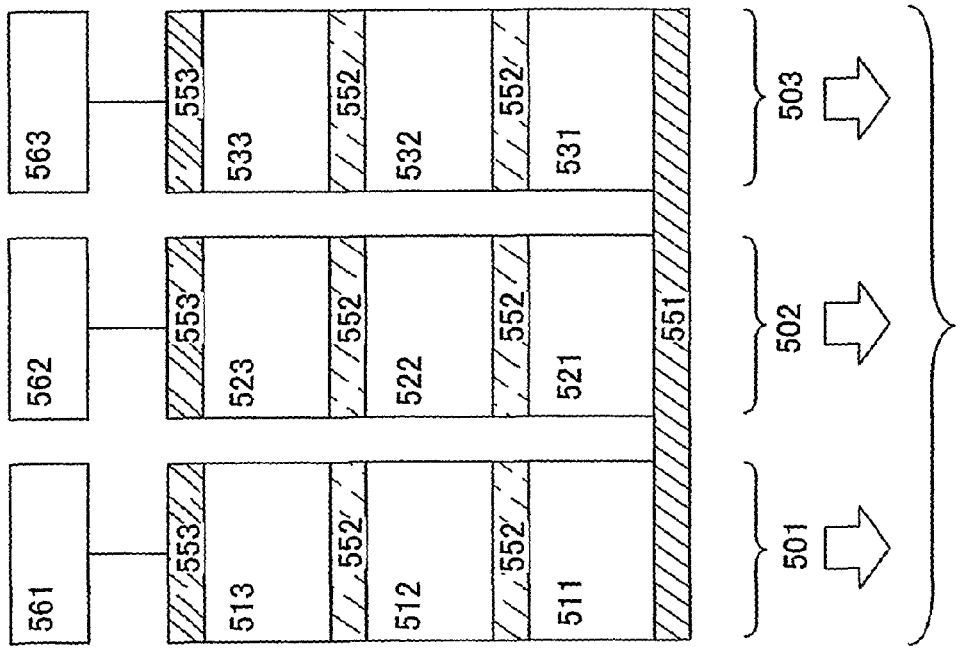

For example, when the first luminescent color becomes remarkable due to change with time, as shown in FIG. 11B, a current flowing to the first light-emitting element from which the first color is strongly emitted is reduced by a first controller 561, a current flowing to the second light-emitting element from which the second luminescent color is strongly emitted is increased by a second controller 562, and a current flowing to the third light-emitting element from which the third luminescent color is strongly emitted is increased by a third controller 563 in order to keep white luminescence as a whole. As described above, the controller is used to change the amount of the current flowing to each light-emitting element so that the luminescent color as a whole pixel can be controlled.

FIG. 4 shows a case where the second electrode is an anode; however, a structure in which the second electrode is a cathode may be also used. In addition, the present embodiment shows a case of white luminescence, but the present invention can be also applied when light of a desired color is intended to be emitted. Although the present embodiment shows an example in which three electroluminescent layers are stacked, the structure is not limited thereto, and the same advantage can be obtained when two or more layers are stacked. Specifically, three light-emitting elements in each of which three electroluminescent layers are stacked may form one pixel as in the present embodiment, two light-emitting elements in each of which two electroluminescent layers are stacked may form one pixel, or a light-emitting element in which three or more electroluminescent layers are stacked may form one pixel. Alternatively, two light-emitting elements in each of which three electroluminescent layers are stacked may form one pixel, or four light-emitting elements in each of which three electroluminescent layers are stacked may form one pixel.

Furthermore, the film thickness of the electroluminescent layer may be different in each light-emitting element. For example, in the present embodiment, the film thickness of each of the light-emitting layers 511, 523 and 532 for the first color may be different. As a result, characteristics of the luminescent color are different in each light-emitting element so that a color can be brought to a desired luminescent color.

It is to be noted that, in order to change the amount of a current applied to each light-emitting element in the same pixel, a method to change electric potential of a power supplying line, or a method to supply the same electric potential of a power supplying line and change a signal from a source line driving circuit can be used.

Figure 12:
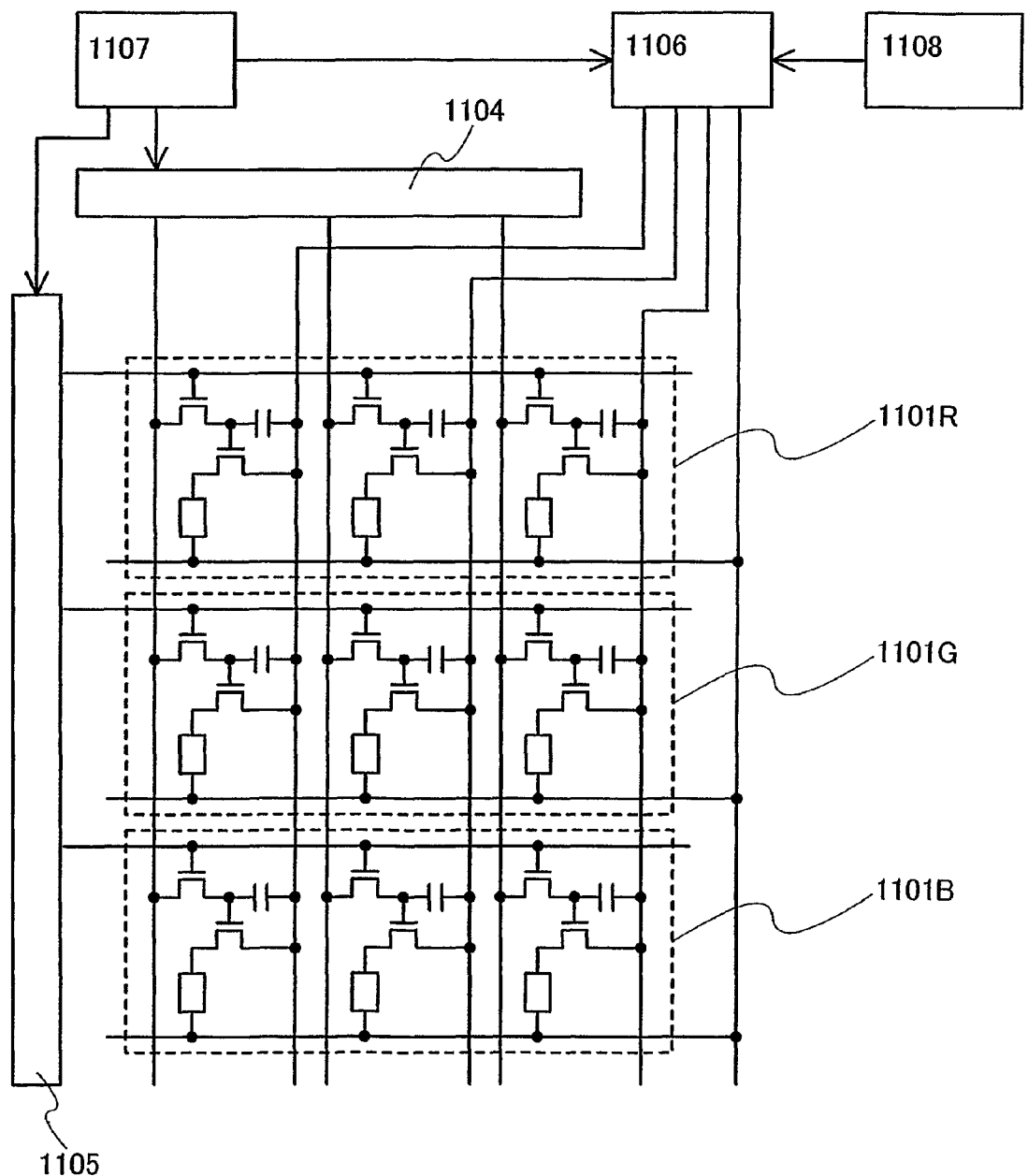
FIG. 12 is an equivalent circuit illustrating a light-emitting device according to the present invention.

FIG. 12 shows an equivalent circuit of a light-emitting device, in which power supplying lines electrically connected to each light-emitting element in the same pixel are independent and electric potential applied to each light-emitting element can be changed.

In FIG. 12, three light-emitting elements are provided in each of pixels 1101R, 1101G and 1101B respectively, and power supplying lines that transmit electric potential supplied to the light-emitting elements are provided independently for the three light-emitting elements. Therefore, a power supply circuit 1106 can supply independent electric potential to each light-emitting element respectively, and thus, luminance of the three light-emitting elements can be controlled independently.

In addition, each pixel is connected to a source line driving circuit 1104 and a gate line driving circuit 1105, and controlled by a signal from the source line driving circuit 1104 and the gate line driving circuit 1105.

Change in luminescent color due to change of each light-emitting element with time is calculated by using a light-emitting element for a monitor, or a result of a lighting time of a light-emitting element and deterioration characteristics of a light-emitting element that have been measured in advance. The level of change with time that is calculated by a monitor circuit 1108 is inputted into the power supply circuit 1106 so that electric potential supplied to each light-emitting element is determined.

A controller 1107 is used to control the source line driving circuit 1104, the gate line driving circuit 1105, and the power supply circuit 1106. It is to be noted that only the power supply circuit 1106 may be used to supply a plurality of electric potential, and the controller 1107 may be used to control the source line driving circuit 1104 and the gate line driving circuit 1105.

As described above, luminance of the three light-emitting elements in one pixel can be controlled independently. In addition, in FIG. 12, it is possible that a red color filter is provided for a pixel 1101R, a green color filter is provided for a pixel 1101G, and a blue color filter is provided for a pixel 1101B respectively so that the light-emitting device can be also used as a display. By using a light-emitting device according to the present invention, change in color due to change with time can be suppressed and a longer lifetime with high luminance can be realized. Therefore, even when the light-emitting device is used as a display, a display can be obtained, in which change in color due to change with time can be suppressed and a longer lifetime with high luminance can be realized.

Figure 13:
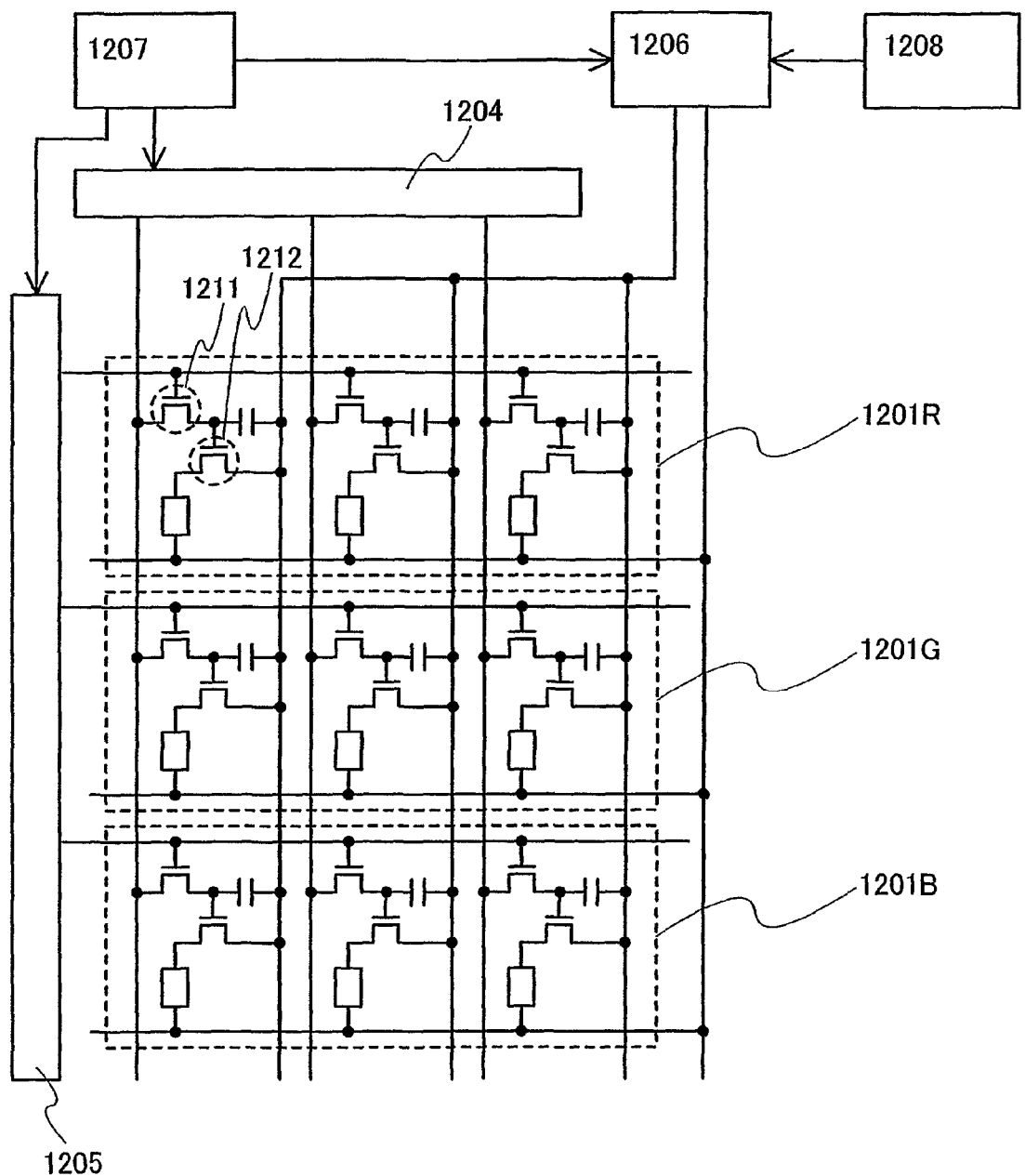
FIG. 13 is an equivalent circuit illustrating a light-emitting device according to the present invention.

FIG. 13 shows an equivalent circuit of a light-emitting device in which the same electric potential of a power supplying line is supplied and a video signal supplied from a source line driving circuit 1204 to a pixel is changed.

In FIG. 13, three light-emitting elements are provided in each of pixels 1201R, 1201G and 1201B respectively, and a power supplying line that transmits electric potential supplied to the light-emitting elements is provided in common for the three light-emitting elements. Therefore, electric potential supplied from a power supply circuit 1206 to each light-emitting element is the same electric potential.

In FIG. 13, each pixel is connected to a source line driving circuit 1204 and a gate line driving circuit 1205, and controlled by a signal from the source line driving circuit 1204 and the gate line driving circuit 1205.

In addition, luminance of each light-emitting element is controlled by a video signal supplied from the source line driving circuit 1204. By changing a video signal, a voltage, which is applied to a gate of a second TFT 1212 when a first TFT 1211 is turned on by a signal from the gate line driving circuit 1205, is changed so that the amount of a current supplied from the power supplying line to the light-emitting elements is changed.

Change in luminescent color due to change of each light-emitting element with time is calculated by using a light-emitting element for a monitor, or a result of a lighting time of a light-emitting element and deterioration characteristics of a light-emitting element that have been measured in advance. The level of change with time that is calculated by a monitor circuit 1208 is inputted into the power supply circuit 1206 so that electric potential supplied to each light-emitting element is determined.

A controller 1207 is used to control the source line driving circuit 1204, the gate line driving circuit 1205, and the power supply circuit 1206. It is to be noted that only the power supply circuit 1206 may be used to supply a plurality of electric potential, and the controller 1207 may be used to control the source line driving circuit 1204 and the gate line driving circuit 1205.

As described above, luminance of the three light-emitting elements in one pixel can be controlled independently. In addition, in FIG. 13, it is possible that a red color filter is provided for a pixel 1201R, a green color filter is provided for a pixel 1201G, and a blue color filter is provided for a pixel 1201B respectively so that the light-emitting device can be also used as a display. By using a light-emitting device according to the present invention, change in color due to change with time can be suppressed and a longer lifetime with high luminance can be realized. Therefore, even when the light-emitting device is used as a display, a display can be obtained, in which change in color due to change with time can be suppressed and a longer lifetime with high luminance can be realized.

Figure 14:
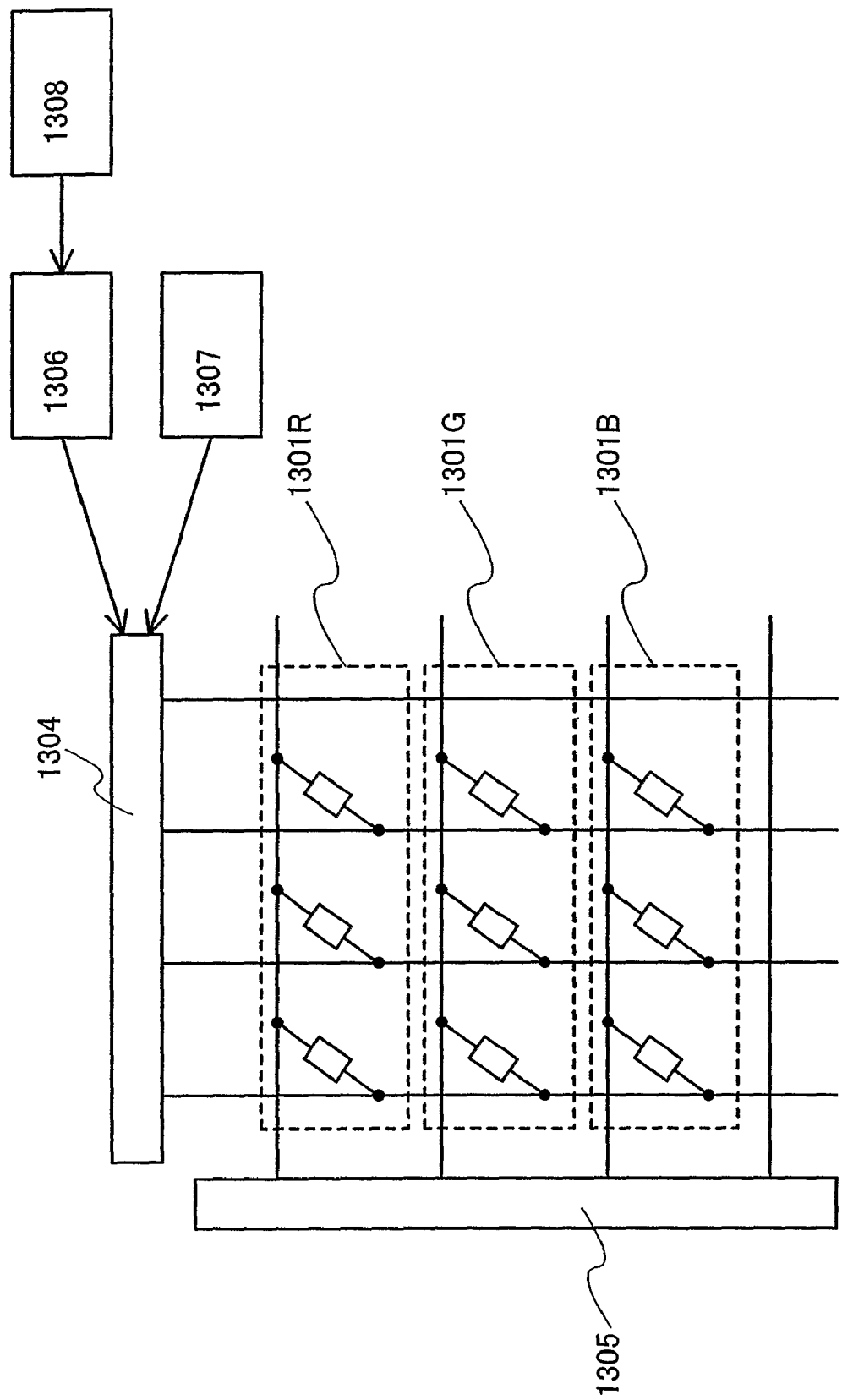
FIG. 14 is an equivalent circuit illustrating a light-emitting device according to the present invention.

Moreover, it is possible that the present invention is applied not only to an active matrix type light-emitting device but also to a passive matrix type light-emitting device. FIG. 14 shows an equivalent circuit in which the present invention is applied to a passive matrix type light-emitting device.

In FIG. 14, each of pixels 1301R, 1301G and 1301B includes three light-emitting elements. Each light-emitting element is controlled based on a signal inputted from a source line driving circuit 1304 and a gate line driving circuit 1305. In addition, luminance of each light-emitting element is determined by value of a current supplied from the source line driving circuit 1304. The value of the current supplied from the source line driving circuit 1304 is controlled by a power supply circuit 1306 and a controller 1307. The power supply circuit 1306 is used to determine the amount of a current applied to the light-emitting elements depending on the level of change of the light-emitting elements with time, which is calculated by a monitor circuit 1308.

As described above, luminance of the three light-emitting elements in one pixel can be controlled independently. In addition, in FIG. 14, it is possible that a red color filter is provided for a pixel 1301R, a green color filter is provided for a pixel 1301G, and a blue color filter is provided for a pixel 1301B respectively so that the light-emitting device can be also used as a display. By using a light-emitting device according to the present invention, change in color due to change with time can be suppressed and a longer lifetime with high luminance can be realized. Therefore, even when the light-emitting device is used as a display, a display can be obtained, in which change in color due to change with time can be suppressed and a longer lifetime with high luminance can be realized.

Embodiment 4

In the present embodiment, a light-emitting device that has a light-emitting element according to the present invention in a pixel portion will be described with reference to FIGS. 5A and 5B. FIG. 5A is a top view showing the light-emitting device and FIG. 5B is a cross-sectional view of FIG. 5A along with A-A'. Reference numeral 801 indicated by a dotted line denotes a driving circuit portion (source side driving circuit), 802 denotes a pixel portion, and 803 denotes a driving circuit portion (gate side driving circuit). In addition, reference numeral 804 denotes a sealing substrate, 805 denotes a sealing material, and the inner side surrounded by the sealing material 805 is a space 807.

Reference numeral 808 denotes a wiring for transmitting signals to be inputted into the source side driving circuit 801 and the gate side driving circuit 803, and the wiring 808 receives a video signal, a clock signal, a start signal, a reset signal and the like from an FPC 809 (flexible print circuit) which serves as an external input terminal. Only the FPC is shown herein; however, a printed wiring board (PWB) may be connected to the FPC. A light-emitting device in the specification includes not only a light-emitting device body itself but also a light-emitting device to which an FPC or a PWB is attached.

Next, the cross-sectional structure will be described with reference to FIG. 5B. A driving circuit portion and a pixel portion are formed over an element substrate 810, and the source side driving circuit 801 which is a driving circuit portion and the pixel portion 802 are shown here.

The source side driving circuit 801 is formed by a CMOS circuit in which an n-channel type TFT 823 and a p-channel type TFT 824 are combined. TFTs forming the driving circuit may be formed by a known CMOS circuit, PMOS circuit or NMOS circuit. Although the present embodiment shows a driver integrated type in which a driving circuit is formed over a substrate, but an integrated type is not necessarily provided, and a driving circuit can be provided outside a substrate, not over a substrate.

The pixel portion 802 is formed by a plurality of pixels each including a switching TFT 811, a current control TFT 812 and a first electrode 813 electrically connected to a drain of the current control TFT 812. It is to be noted that an insulating layer 814 is formed to cover an edge portion of the first electrode 813. The insulating layer 814 is formed by using a positive photosensitive acrylic resin film here.

In order to improve coverage, an upper edge portion or a lower edge portion of the insulating layer 814 is formed to have a curved surface formed with a curvature. For example, when a positive photosensitive acryl is used as a material for the insulating layer 814, it is preferable that only an upper edge portion of the insulating layer 814 has a curved surface with a curvature radius (0.2 to 3 µm). As the insulating layer 814, any of a negative type which becomes insoluble in an etchant by light irradiation and a positive type which becomes soluble in an etchant by light irradiation can be used.

On the first electrode 813, a first electroluminescent layer 815, a charge generation layer 816, a second electroluminescent layer 817 and a second electrode 818 are formed. The first electroluminescent layer 815 and the second electroluminescent layer 817 are formed by evaporation using an evaporation mask or ink-jet. The charge generation layer 816 is formed by sputtering and the second electrode 818 is formed by using a transparent conductive film. The structure of a light-emitting element 819 may have the same structure, for example, as the electroluminescent layer shown in Embodiment 1 or 2.

Furthermore, the sealing substrate 804 is attached to the element substrate 810 with the sealing material 805 to provide a structure in which the light-emitting element 819 is provided in a space surrounded by the element substrate 810, the sealing substrate 804 and the sealing material 805. The space 807 is filled with a filler, and may be filled with an inert gas (such as nitrogen or argon) or a sealing material.

It is preferable to use an epoxy based resin for the sealing material 805, and it is desired that these materials do not allow permeation of moisture or oxygen as far as possible. In addition, as a material for the sealing substrate 804, a plastic substrate including FRP (Fiberglass-Reinforced Plastics), PVF (polyvinyl fluoride), mylar, polyester, acryl or the like can be used in addition to a glass substrate and a quartz substrate.

As described above, a light-emitting device that has a light-emitting element according to the present invention can be obtained. In the present embodiment, two electroluminescent layers are stacked; however, three or more layers may be also stacked.

Embodiment 5

In the present embodiment, various electronic devices partially including a light-emitting device manufactured by using a light-emitting element according to the present invention will be described.

Electronic devices manufactured by using a light-emitting device formed according to the present invention include a video camera, a digital camera, a goggle-type display, a navigation system, a sound reproduction device (such as an in-car audio system or an audio set), a personal computer, a game machine, a personal digital assistant (such as a mobile computer, a cellular phone, a portable game machine, or an electronic book), an image reproduction device equipped with a recording medium (specifically, a device equipped with a display device that is able to reproduce a recording medium such as a digital versatile disc (DVD) and display the image). FIGS. 10A to 10G show specific examples of these electronic devices.

Figure 10A:
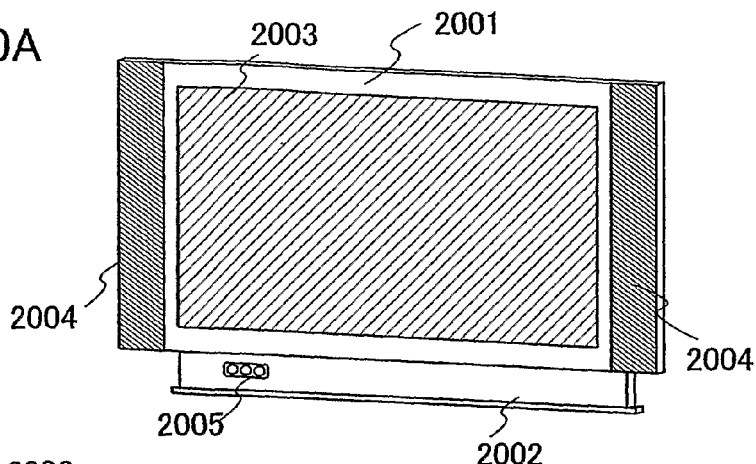
FIGS. 10A to 10G are diagrams showing examples of electronic devices using a light-emitting device according to the present invention.

FIG. 10A is a display device, which includes a frame body 2001, a support 2002, a display portion 2003, a speaker portion 2004, a video input terminal 2005 and the like. The display device is manufactured by using a light-emitting device according to the present invention for the display portion 2003. The display device includes all devices for displaying information such as devices for a personal computer, for receiving TV broadcasting, for displaying an advertisement and the like.

Figure 10B:
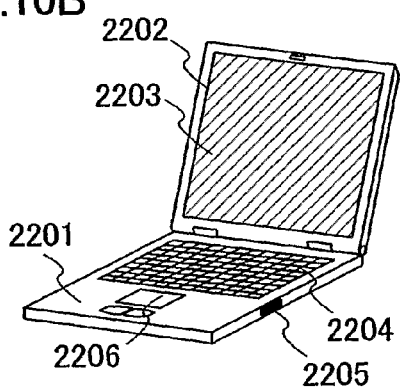

FIG. 10B is a personal computer, which includes a main body 2201, a frame body 2202, a display portion 2203, a keyboard 2204, an external connection port 2205, a pointing mouse 2206 and the like. The personal computer is manufactured by using a light-emitting device according to the present invention for the display portion 2203.

Figure 10C:
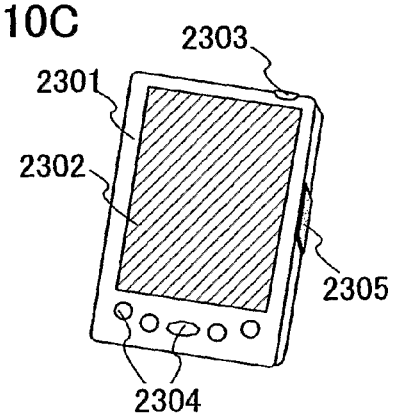

FIG. 10C is a mobile computer, which includes a main body 2301, a display portion 2302, a switch 2303, an operation key 2304, an infrared port 2305 and the like. The mobile computer is manufactured by using a light-emitting device according to the present invention for the display portion 2302.

Figure 10D:
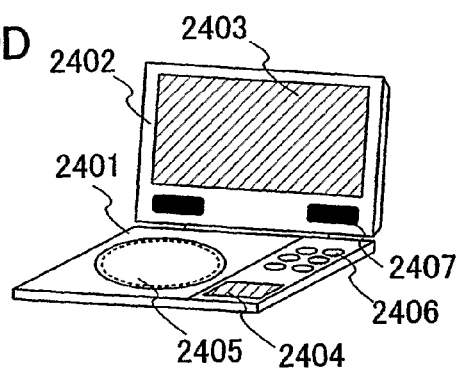

FIG. 10D is a portable image reproduction device equipped with a recording medium (specifically, a DVD reproduction device), which includes a main body 2401, a frame body 2402, a display portion A 2403, a display portion B 2404, a recording medium (such as DVD) reading portion 2405, an operation key 2406, a speaker portion 2407 and the like. The display portion A 2403 is used for mainly displaying image information while the display portion B 2404 is used for mainly displaying character information. The portable image reproduction device is manufactured by using a light-emitting device according to the present invention for the display portion A 2403 and the display portion B 2404. The image reproduction device equipped with the recording medium also includes a home game machine and the like.

Figure 10E:
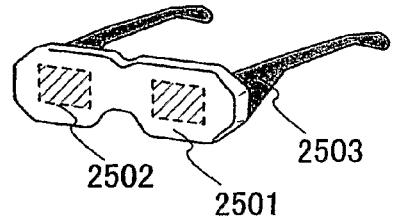

FIG. 10E is a goggle-type display, which includes a main body 2501, a display portion 2502 and an arm portion 2503. The goggle-type display is manufactured by using a light-emitting device according to the present invention for the display portion 2502.

Figure 10F:
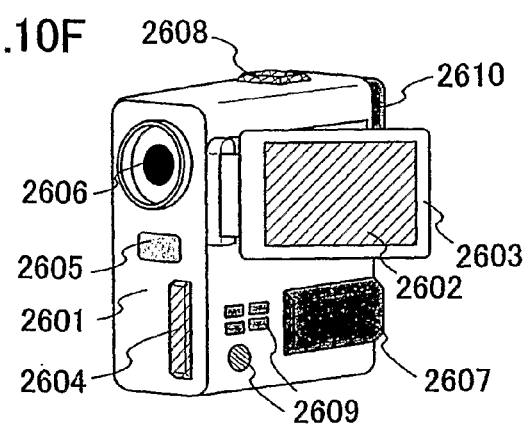

FIG. 10F is a video camera, which includes a main body 2601, a display portion 2602, a frame body 2603, an external connection port 2604, a remote control receiving portion 2605, an image receiving portion 2606, a battery 2607, a sound input portion 2608, an operation key 2609, an eye piece 2610 and the like. The video camera is manufactured by using a light-emitting device according to the present invention for the display portion 2602.

Figure 10G:
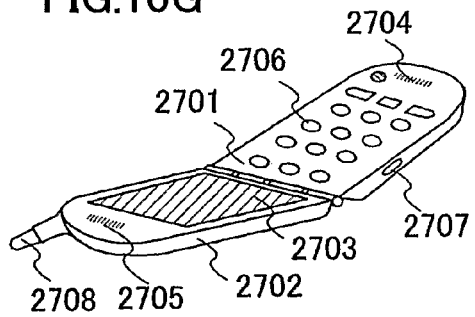

FIG. 10G is a cellular phone, which includes a main body 2701, a frame body 2702, a display portion 2703, a sound input portion 2704, a sound output portion 2705, an operation key 2706, an external connection port 2707, an antenna 2708 and the like. The cellular phone is manufactured by using a light-emitting device according to the present invention for the display portion 2703.

The use of a light-emitting element according to the present invention can provide a light-emitting element and a light-emitting device in which a longer lifetime is realized when light is emitted with high luminance and there are fewer defects due to sputter damage.

The invention claimed is:

1. A light-emitting element comprising:
   a light-emitting layer;
   a charge generation layer over the light-emitting layer; and
   a layer containing a benzoxazole derivative between the light-emitting layer and the charge generation layer.

2. A light-emitting element comprising:
   a first light-emitting layer;
   a first layer containing a benzoxazole derivative over the first light-emitting layer;
   a charge generation layer over the first layer containing the benzoxazole derivative;
   a second light-emitting layer over the charge generation layer; and
   a second layer containing a benzoxazole derivative over the second light-emitting layer.

3. The light-emitting element according to claim 2, further comprising an electrode over the second layer containing the benzoxazole derivative.

4. A light-emitting element comprising:
   at least two light-emitting layers;
   at least one charge generation layer; and
   at least one layer containing a benzoxazole derivative,
   wherein the charge generation layer is formed between the respective light-emitting layers, and
   the layer containing the benzoxazole derivative is in contact with the charge generation layer.

5. The light-emitting element according to claim 4, wherein the charge generation layer is formed by sputtering.

6. The light-emitting element according to any one of claims 1, 2, and 4, wherein the charge generation layer is a transparent conductive film.

7. A light-emitting device using the light-emitting element according to any one of claims 1, 2, and 4.

8. A light-emitting device comprising:
   a first light-emitting element and a second light-emitting element in one pixel,
   wherein the respective first and second light-emitting elements comprising:
   a first light-emitting layer and a second light-emitting layer in different types;
   a layer containing a benzoxazole derivative between the first light-emitting layer and the second light-emitting layer; and
   a charge generation layer is formed between the layer containing the benzoxazole derivative and the second light-emitting layer,
   wherein a stacking sequence of the first and second light-emitting layers is different in each of the first and second light-emitting elements.

9. The light-emitting device according to claim 8, wherein the respective first and second light-emitting elements further comprises a third light-emitting layer.

10. The light-emitting device according to claim 8, wherein the light-emitting device has a control means to control an amount of current flowing to the first and second light-emitting elements independently.

11. The light-emitting device according to claim 8, wherein the charge generation layer is a transparent conductive film.

* * * * *